US010570010B1

(12) United States Patent
Finnegan et al.

(10) Patent No.: US 10,570,010 B1
(45) Date of Patent: Feb. 25, 2020

(54) FABRICATION OF MULTILAYERED CARBON MEMS DEVICES

(71) Applicant: National Technology & Engineering Solutions of Sandia, LLC, Albuquerque, NM (US)

(72) Inventors: Patrick Sean Finnegan, Albuquerque, NM (US); Cody M. Washburn, Albuquerque, NM (US); David Bruce Burckel, Albuquerque, NM (US); David R. Wheeler, Albuquerque, NM (US); Timothy N. Lambert, Albuquerque, NM (US); Lee Taylor Massey, Livermore, CA (US); Jennifer Marie Strong, Rio Rancho, NM (US); Christopher Dyck, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 151 days.

(21) Appl. No.: 15/624,928

(22) Filed: Jun. 16, 2017

Related U.S. Application Data

(60) Provisional application No. 62/351,759, filed on Jun. 17, 2016.

(51) Int. Cl.
*H01L 21/027* (2006.01)
*B81C 1/00* (2006.01)

(52) U.S. Cl.
CPC .. *B81C 1/00476* (2013.01); *B81C 2201/0107* (2013.01); *B81C 2201/0109* (2013.01);
(Continued)

(58) Field of Classification Search
CPC .................................................... H01L 21/027
See application file for complete search history.

(56) References Cited

U.S. PATENT DOCUMENTS

2006/0018360 A1* 1/2006 Tai ........................... G01J 5/20 374/121
2007/0002156 A1* 1/2007 Hagood, IV .......... G02B 26/04 348/296

(Continued)

OTHER PUBLICATIONS

Dyck, et al., “Carbon Composite Microelectromechanical Systems (CMEMS)”, SAND2016-1753, Feb. 29, 2016, 57 Pages.

(Continued)

*Primary Examiner* — Mohammad M Choudhry
(74) *Attorney, Agent, or Firm* — Madelynne J. Farber; Mark A. Dodd

(57) ABSTRACT

The various technologies presented herein relate to formation of carbon micromechanical systems (CMEMS), wherein the CMEMS comprise multiple layers of carbon structures and are formed using a plurality of photoresist precursors that are processed to form carbon. The various embodiments can be utilized in producing a plurality of CMEMS with full production level fabrication, e.g., 6 inch wafers can be processed. A pyrolyzed layer of carbon is lithographically defined after pyrolysis, wherein the post-pyrolysis etch process can produce carbon structures having repeatable and accurate device geometries, with straight sidewalls. A sacrificial layer can be applied to facilitate separation of a first carbon layer from a second carbon layer, wherein, upon pyrolysis to form the second carbon layer and lithography thereof, the sacrificial layer is removed to form a CMEMS comprising a first carbon layer (e.g., comprising bottom contacts) located beneath a second carbon layer (e.g., a mechanical layer).

15 Claims, 4 Drawing Sheets

180
170A
170
150C
130C
120
110

(52) U.S. Cl.
CPC ................. *B81C 2201/0132* (2013.01); *B81C 2201/0197* (2013.01); *B81C 2201/0198* (2013.01)

(56) References Cited

U.S. PATENT DOCUMENTS

2008/0043304 A1* 2/2008 Stalford ................ B81B 3/0062 359/196.1
2008/0164611 A1* 7/2008 Hedler .............. H01L 21/76885 257/739
2010/0130005 A1* 5/2010 Lee ..................... B81C 99/0085 438/652
2010/0330332 A1* 12/2010 Quenzer ............... B81B 7/0067 428/141
2012/0223048 A1* 9/2012 Paranjpe ............... C23C 14/042 216/22

OTHER PUBLICATIONS

Washburn, et al., "Tunable Young's Modulus in Carbon MEMS Using Graphene-based Stiffeners", In ECS Transactions, vol. 50, No. 12, 2013, 11 Pages.

* cited by examiner

FABRICATION OF MULTILAYERED CARBON MEMS DEVICES

RELATED APPLICATION

This application claims priority to U.S. Provisional Patent Application No. 62/351,759, filed on Jun. 17, 2016, and entitled "Production Scale Fabrication of Tunable, Multi-layered, All Carbon MEMS Devices for Harsh Environments", the entirety of which is incorporated herein by reference.

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

BACKGROUND

Micro-machined carbon enables the fabrication of carbon micromechanical systems (CMEMS) for application in harsh environments, whereby the chemical inertness of carbon enables it to be utilized in applications encountering high temperature, gamma radiation, X-ray exposure, and neutron affluence exposure. However, conventional fabrication technologies, e.g., CMEMS derived from photoresist precursors, are limited in finding application in full scale production, e.g., only a few devices can be produced at a time at the small single partial wafer level. For example, when forming carbon with a typical pyrolysis process comprising pyrolysis of a photoresist, the photoresist is lithographically patterned prior to pyrolysis, which can result in uncontrollable dimensioning of critical features and device geometries resulting from polymer reflow at elevated processing temperatures. A final cross section of a carbon MEMS beam that is formed by pyrolysis after the beam has been patterned, rather than being rectangular, the cross section has an elliptical or rounded geometry, wherein the rounded geometry can give rise to increased susceptibility to torsional bending modes. Such effects are shown in FIGS. 11 and 12, wherein FIG. 11 is a scanning electron microscope (SEM) image 1100 illustrates a structure having a curved profile 1110 ("air wing") resulting from reflow during the pyrolysis, and FIG. 12, SEM image 1200 illustrates a plurality of cantilevers 1210A-D that have undergone reflow and have lost the desired rectangular profile. It is apparent that a conventional process of patterning and then pyrolysis, it can be difficult to maintain control over sidewall profiling to achieve small critical dimensions, to facilitate close representation of (correspond to) a finite element analysis model.

SUMMARY

The following is a brief summary of subject matter that is described in greater detail herein. This summary is not intended to be limiting as to the scope of the claims.

Various exemplary embodiments presented herein relate to the formation of carbon micromechanical systems (CMEMS), wherein the CMEMS comprise multiple layers of carbon structures and are formed using a plurality of polymer precursors that are processed, e.g., pyrolyzed, to form carbon. The various embodiments can be utilized in producing a plurality of CMEMS with full production level fabrication, e.g., 6 inch diameter wafers can be processed.

A pyrolyzed layer of carbon is lithographically defined after pyrolysis, wherein the post-pyrolysis etch process can produce carbon structures having repeatable and accurate device geometries, with straight sidewalls, wherein the sidewalls could be formed perpendicular to an underlying substrate, or can have a stepped profile, a trapezoidal form, a flat angled form, etc. A sacrificial layer can be applied to facilitate separation of a first carbon layer from a second carbon layer, wherein, upon pyrolysis to form the second carbon layer and lithography thereof, the sacrificial layer is removed to form a CMEMS comprising a first carbon layer (e.g., comprising bottom contacts) located beneath a second carbon layer (e.g., a mechanical layer). The process of forming a second carbon layer on the first carbon layer can be repeated as necessary to facilitate a third layer being formed over the second layer, and an $n^{th}$ layer being formed thereon, where n is a positive integer. In an embodiment, an inductively reactive ion plasma (ICP) can be utilized to pattern the carbon layers, wherein the carbon etch can utilize $O_2/Ar/SF_6$ chemistry.

In a simplification of the various embodiments presented herein, the process of fabricating the CMEMS comprises:

a) form a first polymer layer on a substrate;

b) pyrolyze the first polymer layer such that it decomposes to form a first carbon layer;

c) pattern the first carbon layer to form a desired structure (a layout of bottom contacts), wherein the patterning is with a mask (e.g., a hard mask);

d) form a sacrificial layer over the patterned first carbon layer and underlying substrate, wherein, in an embodiment, the sacrificial layer can be polysilicon, silicon dioxide ($SiO_2$), silicon nitride ($Si_3N_4$), a metal, or any other suitable material that can be removed by etching, etc., and pattern the sacrificial layer as desired;

e) form a second polymer layer over the patterned sacrificial layer, pyrolyze the second polymer layer such that it decomposes to form a second layer of carbon, and pattern the second carbon layer (e.g., with a photoresist, or with a hard mask and ICP etch); and f) remove the sacrificial layer to leave the second carbon layer located over the first carbon layer, wherein removal of the sacrificial layer causes a region that was previously filled with the sacrificial layer to form an opening (gap, void) between the first carbon layer and the second carbon layer, wherein the sacrificial layer can be removed with a vapor pressure system, e.g., utilizing xenon difluoride ($XeF_2$), an etching process utilizing a dry etch, an aqueous solution etch, etc.;

g) repeat steps (d)-(f) as required to form subsequent layers of patterned pyrolyzed carbon over layers of previously formed layers of patterned pyrolyzed carbon, e.g., a second sacrificial layer is formed over the second patterned carbon layer, the second sacrificial layer is patterned, a third polymer layer is formed and pyrolyzed to form a third carbon layer on the second sacrificial layer, the third carbon layer is patterned and the sacrificial layer is removed to facilitate formation of a CMEMS comprising of three patterned carbon layers.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
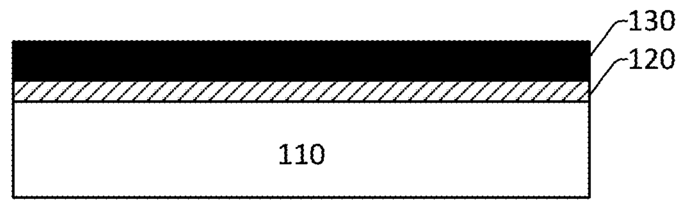
FIG. 1 illustrates a block diagram representation of initial layers being formed for formation of a CMEMS comprising a plurality of carbon layers, according to an embodiment.

Various technologies pertaining to manufacture of carbon micromechanical systems (CMEMS) by utilizing photoresist precursors are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term “or” is intended to mean an inclusive “or” rather than an exclusive “or”. That is, unless specified otherwise, or clear from the context, the phrase “X employs A or B” is intended to mean any of the natural inclusive permutations. That is, the phrase “X employs A or B” is satisfied by any of the following instances: X employs A; X employs B; or X employs both A and B. In addition, the articles “a” and “an” as used in this application and the appended claims should generally be construed to mean “one or more” unless specified otherwise or clear from the context to be directed to a singular form. Additionally, as used herein, the term “exemplary” is intended to mean serving as an illustration or example of something, and is not intended to indicate a preference.

As noted above, exemplary embodiments presented herein relate to formation of CMEMS, wherein the CMEMS comprise one or more layers of carbon structures and are formed using one or more photoresist precursors that are processed to form carbon. In comparison with conventional approaches to CMEMS fabrication, the various embodiments presented herein are applicable to full production level fabrication, enabling full size wafers (e.g., 6 inch diameter wafers) to be processed through cassette fed production tools, with an according large number of devices being produced per lot.

As previously mentioned, forming carbon with a typical pyrolysis of a photoresist process can result in uncontrollable critical dimensions and device geometries owing to polymer reflow (photoresist reflow) at elevated processing temperatures, e.g., unwanted rounded geometry. As presented in the various embodiments herein, a pyrolyzed layer of carbon is lithographically defined after pyrolysis, wherein an etch process can produce highly repeatable and accurate device geometries, with the resulting structures having straight sidewalls.

FIGS. 1-8 illustrate respective deposition, conversion, and/or removal operations being performed to facilitate fabrication of a CMEMS, wherein the respective carbon layers are formed by pyrolyzing patterned photoresists. It is to be appreciated that FIGS. 1-8 illustrate a portion of one or more CMEMSs being formed on a wafer, and the illustrations are present to facilitate understanding of the various operations involved in connection with fabricating a CMEMS. Accordingly, the portion illustrated in FIGS. 1-8 is a portion of a wafer (e.g., a 6 inch diameter wafer) that is undergoing fabrication.

FIG. 1 illustrates an initial structure 100 upon which a CMEMS is fabricated, wherein the CMEMS comprises multiple carbon layers and structures. The initial structure 100 comprises a substrate 110, with an electrical isolation layer 120 and a layer of pyrolyzed carbon 130 (first carbon layer). In an embodiment, the substrate 110 can be a silicon (Si) wafer, or other suitable support, e.g., glass, polymer, etc. In another embodiment, the electrical isolation layer 120 can be a nitride on oxide layer (e.g., silicon nitride over silicon dioxide (SiN over $SiO_2$)), or other suitable material. In a further embodiment, the electrical isolation layer 120 does not have to be present, and the layer of pyrolyzed carbon 130 can be formed directly on the substrate 110. The pyrolyzed carbon layer 130 (first carbon layer) is formed by initially forming a layer of polymer (a first photoresist precursor) which is spin coated (e.g., at 3000 rpm) over the substrate 110 (or the electrical isolation layer 120, if present), wherein the polymer layer is pyrolyzed to convert the polymer layer to form the carbon layer 130.

Pyrolysis of the first photoresist precursor to form the pyrolyzed carbon layer can be performed at any suitable temperature to facilitate conversion of the first photoresist precursor to carbon, e.g., the pyrolysis temperature can be about 1150° C. The polymer layer (e.g., the photoresist precursor) can be formed from any suitable material that pyrolytically decomposes to form the carbon layer 130 with desired properties and a desired thickness. The photoresist precursor can be any of a diazonaphthoquinone (DNQ)-based material, a phenol formaldehyde resin, a phenolic resin, a NOVOLAC resin, a DNQ-NOVOLAC resin, any materials which can be formed by E-beam and X-ray patternable chemistries, and further can include Poly(methyl methacrylate) (PMMA), Hydrogen silsesquioxane (HSQ), and silane based backbones, etc. Pyrolysis of the carbon layer 130 can be controlled to promote the formation of a particular form of carbon hydridization, e.g., $sp^2$-hybrid orbital, $sp^3$-hybrid orbital, etc., where, in an embodiment, the CMEMS can be fabricated with a plurality of carbon layers comprising $sp^2$-hybrid orbital carbon and/or $sp^3$-hybrid orbital carbon, to take advantage of the higher conductivity of the $sp^2$-hybrid orbital carbon over the $sp^3$-hybrid orbital carbon. The thickness of the carbon layer 130 can be a thin layer (e.g., <2.5 μm, <10 μm) or a thicker layer (e.g., up to about 100 μm, about 60 μm).

Figure 2:
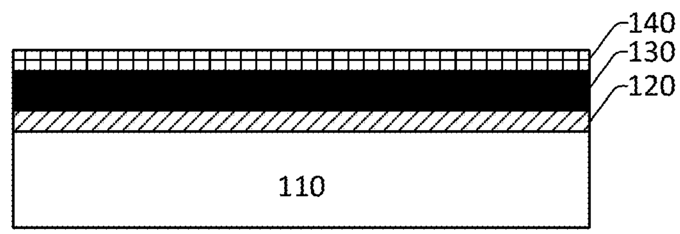
FIG. 2 illustrates a block diagram representation of a mask being applied to a pyrolyzed carbon layer, according to an embodiment.

Turning to FIG. 2, a mask layer 140 is formed over the pyrolyzed carbon layer 130. Any suitable photo defined etch mask for masking the carbon layer 130 during etching can be utilized. In an embodiment where the carbon layer 130 is thin enough (e.g., <2.5 μm), a photo resist can be utilized as the mask layer 140. However, for thicker layers of carbon layer 130, a hard mask can be utilized. In an embodiment, the mask layer 140 can be formed from high-density plasma $SiO_2$ (e.g., deposited by Plasma-enhanced chemical vapor deposition (PECVD)) which is robust and can be removed following etching of the carbon layer 130. Other materials for mask layer 140 include various silane-based materials such as $SiH_4/Ar/O_2$ high-density plasma oxide (e.g., with an etch selectivity of about 2:1), a $SiH_4/N_2O/N_2$ based CVD oxide, an alumina ($Al_2O_3$) physical vapor deposition layer (e.g., deposited with an e-beam evaporator), etc. Any suitable patterning technique can be utilized, e.g., reactive-ion etch (RIE). A carbon etch can be utilized, such as an inductively reactive ion plasma (ICP), to define both the carbon layer 130 (bottom contact layer) and the subsequently formed carbon layer 170 (mechanical layer). In an example embodiment, the carbon etch can utilize $O_2/Ar/SF_6$ chemistry.

As previously mentioned, by patterning the carbon layer 130 after it has been formed by pyrolysis, it is possible to achieve a greater level of dimensional accuracy than can be achieved by the conventional approach of patterning the polymer layer and subsequently pyrolyzing the polymer layer (photoresist precursor) to form the pyrolyzed carbon layer 130. With the latter, conventional approach, the polymer can undergo reflow at elevated processing temperatures leading to uncontrollable dimensioning of critical features and device geometries. However, per the various embodiments presented herein, with patterning occurring after the carbon layer 130 has been formed by pyrolysis, the carbon layer 130 is a stable, inert layer, with a higher degree of dimensional accuracy being achievable (e.g., by ICP) than can be achieved with the conventional approach of patterning prior to pyrolysis, and further, owing to the chemically and physically stable nature of the carbon layer 130, a patterned surface (e.g., such as a sidewall 130D shown in FIG. 3) can be formed with a high degree of angular consistency, e.g., verticality.

Figure 3:
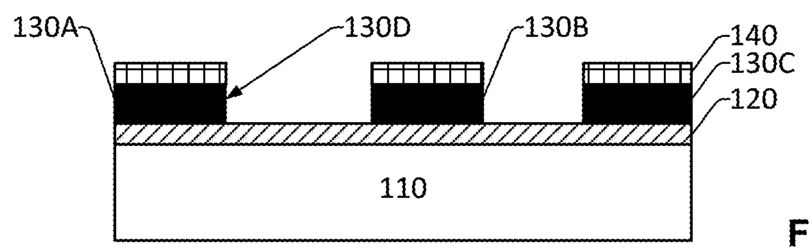
FIG. 3 illustrates a block diagram representation of a pyrolyzed carbon layer being patterned, according to an embodiment.

FIG. 3 illustrates the mask layer 140 and the carbon layer 130 after patterning of the carbon layer 130 has occurred, wherein the respective regions of the mask layer 140 act to protect the underlying regions of the carbon layer 130. After patterning, the mask layer 140 can be removed to leave the various regions of the carbon layer 130A-C, as desired. In an embodiment, the carbon regions 130A-C can form bottom contacts of the CMEMS.

Figure 4:
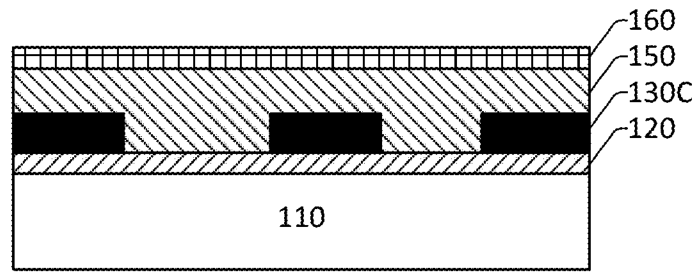
FIG. 4 illustrates a block diagram representation of a sacrificial layer and mask being applied to an underlying pyrolyzed carbon layer, according to an embodiment.

FIG. 4 illustrates a sacrificial layer 150 formed over the carbon regions 130A-C, and a mask 160 formed on the sacrificial layer 150. As shown in FIG. 4, the sacrificial layer 150 fills any voids/regions between the carbon regions 130A-C. The sacrificial layer 150 can be formed from any suitable material, such as polysilicon (polycrystalline silicon), silicon dioxide ($SiO_2$), silicon nitride ($Si_3N_4$), a metal, or any other material that can be removed with suitable technologies such as dry etch methodologies or aqueous dissolution. CMEMS structures have been released in HF followed by a supercritical dry, to avoid problems associated with surface tension forces, e.g., stiction, and can function as a sacrificial layer to a subsequently formed carbon layer (as further described herein). Any suitable technique can be utilized to form the sacrificial layer 150, e.g., low-pressure chemical vapor deposition (LPCVD), physical vapor deposition, CVD, and where the sacrificial layer 150 is formed from a metal, sputtering, electroplating, or evaporation deposition, can be utilized. In an embodiment, the composition of the sacrificial layer is selected such that when the polymer layer is pyrolyzed to form a carbon layer (e.g., polymer layer 170 is pyrolyzed to form the carbon layer 170) the sacrificial layer (e.g., sacrificial layer 150) remains intact to as to prevent disruption of the pyrolyzation process.

Figure 5:
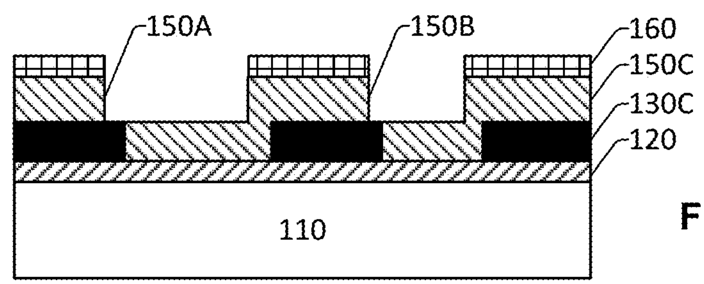
FIG. 5 illustrates a block diagram representation of a sacrificial layer being patterned, according to an embodiment.
Figure 6:
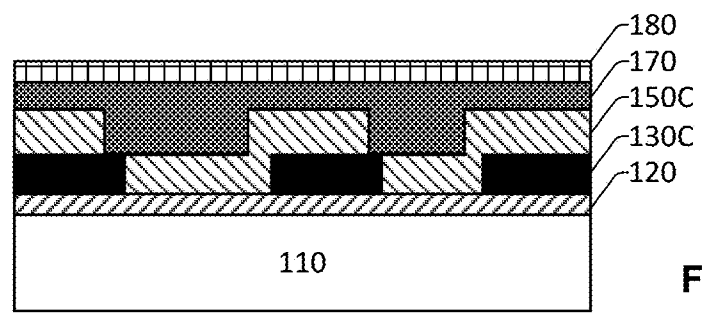
FIG. 6 illustrates a block diagram representation of a polymer layer being formed over the patterned sacrificial layer and a mask layer formed thereon, according to an embodiment.

Turning to FIG. 5, the sacrificial layer 150 is photolithographically masked (e.g., through use of the mask 160), and further, sacrificial cuts can be selectively etched to remove the sacrificial layer 150 from any areas/regions that are intended to anchor a mechanical carbon structure (structure 170, as depicted in FIG. 6 and described below) to the underlying substrate 110, or the bottom contacts (e.g., carbon regions 130A-C). Accordingly, in an operation where the sacrificial layer 150 comprises polysilicon, following removal of regions of the sacrificial layer 150, a structure results with regions of polysilicon 150A-C located above the carbon regions 130A-C, and the mask 160 located on the regions of polysilicon 150A-C. While the regions 150A-C are described as being formed with polysilicon, the regions 150A-C can comprises any of $SiO_2$, $Si_3N_4$, a metal, or any other material, as previously described.

FIG. 6 illustrates a layer of photoresist 170 (a second photoresist precursor) being formed over the remaining regions of polysilicon 150A-C (e.g., mask 160 has been removed) and carbon regions 130A-C. The photoresist 170 can be spun applied, wherein the desired photoresist material and spin-speeds are utilized to achieve a desired thickness of photoresist layer 170. In an embodiment, the photoresist layer 170 can be formed on the regions of polysilicon 150A-C and the carbon regions 130A-C. The structure can then undergo pyrolysis to facilitate conversion of material in the photoresist 170 to form a carbon mechanical layer 170 (second carbon layer).

Figure 7:
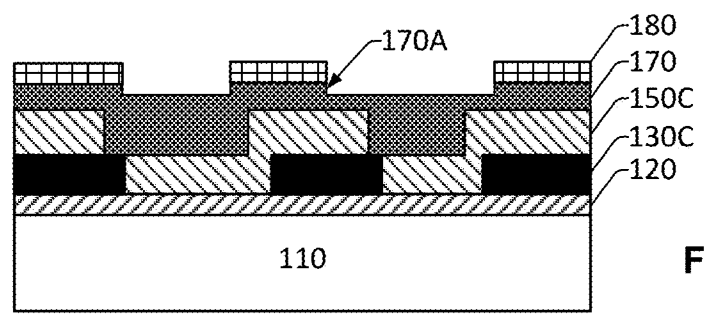
FIG. 7 illustrates a block diagram representation of a pyrolyzed carbon layer being patterned, according to an embodiment.

Turning to FIG. 7, the carbon mechanical layer 170 can then be photo-lithographically aligned to the carbon regions 130A-C (e.g., aligned to the bottom contacts), and a mask layer 180 applied thereto. Masking and etching operations can be performed as desired (e.g., as previously described with regard to using mask 140 to pattern the carbon layer 130 to form the carbon regions 130A-C), e.g., RIE, ICP, to pattern the carbon mechanical layer 170, e.g., with sidewall 170A. As previously mentioned with regard to carbon layer 130, with patterning occurring after the carbon layer 170 has been formed by pyrolysis, the carbon layer 170 is a stable, inert layer, with a higher degree of dimensional accuracy being achievable (e.g., by ME, ICP) than can be achieved with the conventional approach of patterning prior to pyrolysis, and further, owing to the chemically and physically stable nature of the carbon layer 170 any patterned surfaces (e.g., a sidewall 170A) can be formed with a high degree of angular consistency, e.g., verticality.

Figure 10:
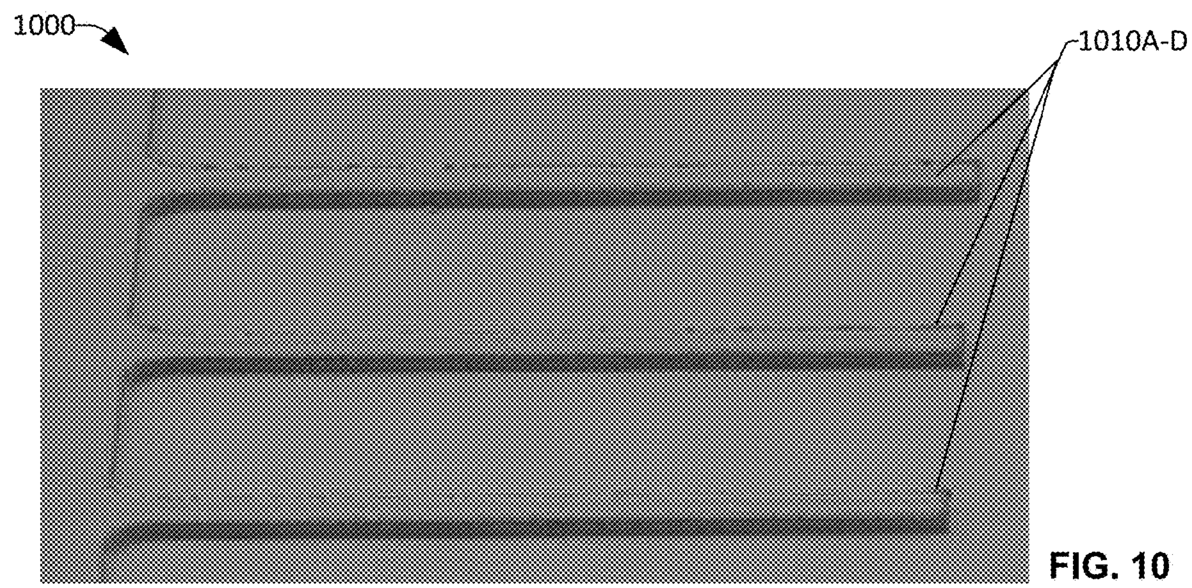
FIG. 10 is an SEM micrograph of a cantilever structure formed with one or more embodiments presented herein.
Figure 11:
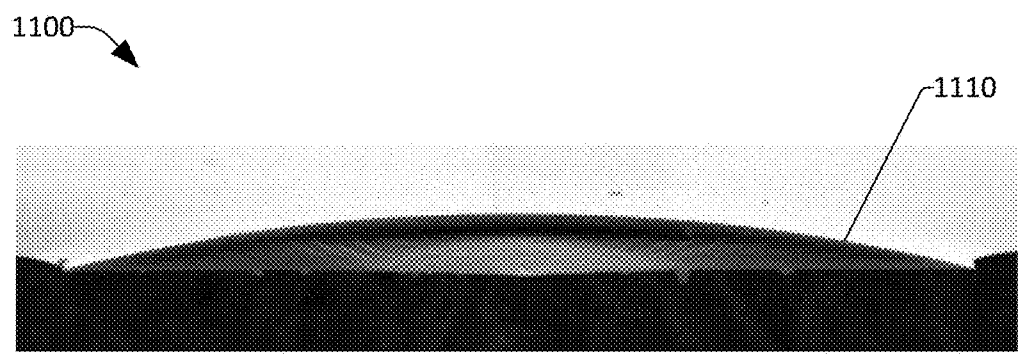
FIG. 11 is a prior art SEM micrograph of a structure having undergone reflow, “aircraft wing”.
Figure 12:
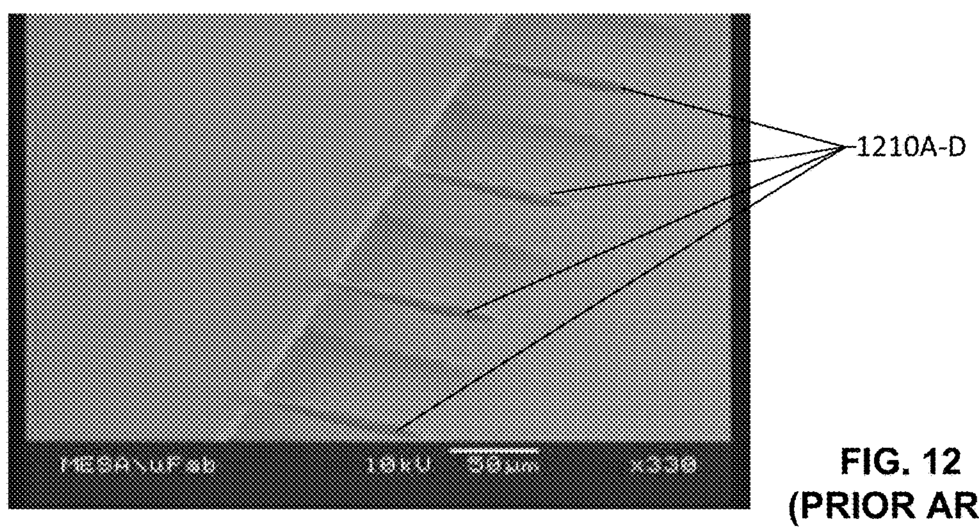
FIG. 12 is a prior art SEM micrograph illustrating cantilevers having undergone reflow.

It is to be appreciated that owing to the patterning of the carbon mechanical layer 170 occurs after the layer has been pyrolyzed to form carbon, the various markings resulting from vertical stripping on a side wall of the CMEMS device processed in ICP techniques. Conversely, with a conventional system wherein the layer is patterned and then pyrolyzed, distortion of the reflow after patterning and pyrolyzation (e.g., forming the air plane wing profile, per FIGS. 11 and 12). FIG. 10 illustrates an SEM image 1000 of a layer comprising a plurality of cantilevers 1010A-D fabricated with the various embodiments presented herein, wherein the cantilevers 1010A-D have a square profile owing to the patterning occurring prior to the pyrolysis, and it is readily apparent that the cantilevers 1010A-D have retained their desired structure compared to the cantilevers 1210A-D that have undergone reflow.

Figure 8:
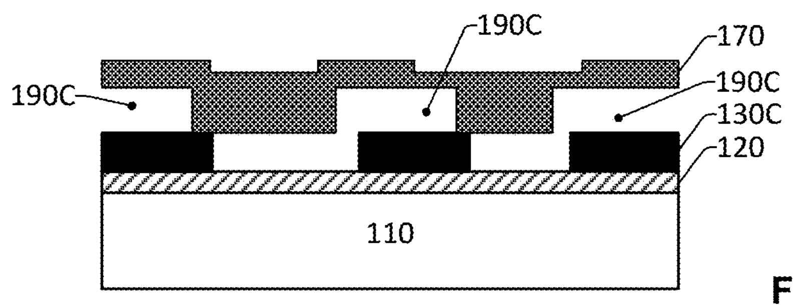
FIG. 8 illustrates a block diagram representation of a sacrificial layer being removed to leave a second carbon layer (mechanical layer) over a first carbon layer (bottom contacts), according to an embodiment.

FIG. 8 illustrates a carbon mechanical layer 170 which has undergone etching, as previously described. Further, the sacrificial layer 150 has been removed, leaving the carbon mechanical layer 170 located over the carbon regions 130A-C (e.g., located over the bottom contacts), wherein removal of the sacrificial layer 150 (as regions 150A-C) results in openings (voids, gaps) 190A-C being formed between the carbon regions 130A-C and the carbon layer 170 (e.g., the openings are filled with ambient gas). Any suitable technology can be utilized to remove the sacrificial layer 150, such as an etch process utilizing an isotropic dry etch, an aqueous solution etch, etc., having specific selectivity to etch the material comprising the sacrificial layer 150. For example, a xenon difluoride ($XeF_2$) vapor pressure system can be used to remove the sacrificial layer 150 from under the carbon mechanical layer 170, thereby leaving freestanding carbon mechanical devices located over the bottom contacts, resulting in a multilayered complex MEMS device fabricated entirely from carbon.

In an embodiment, any microporous regions in the carbon regions 130A-C or the carbon layer 170, and also the openings 190A-C, can be back filled or infiltrated, with polymers (epoxies, photodefinable materials) and/or polymers filled with nano-composites. Further, it is possible to electrodeposit metals such as gold, nickel and platinum directly into and on top of porous carbon forming carbon regions 130A-C or the carbon layer 170.

It is to be appreciated that another carbon mechanical layer can be formed over the carbon mechanical layer 170 by repeating the formation and removal of a second sacrificial layer and a second mechanical layer over the carbon mechanical layer 170, as described in FIGS. 6-8.

Figure 9:
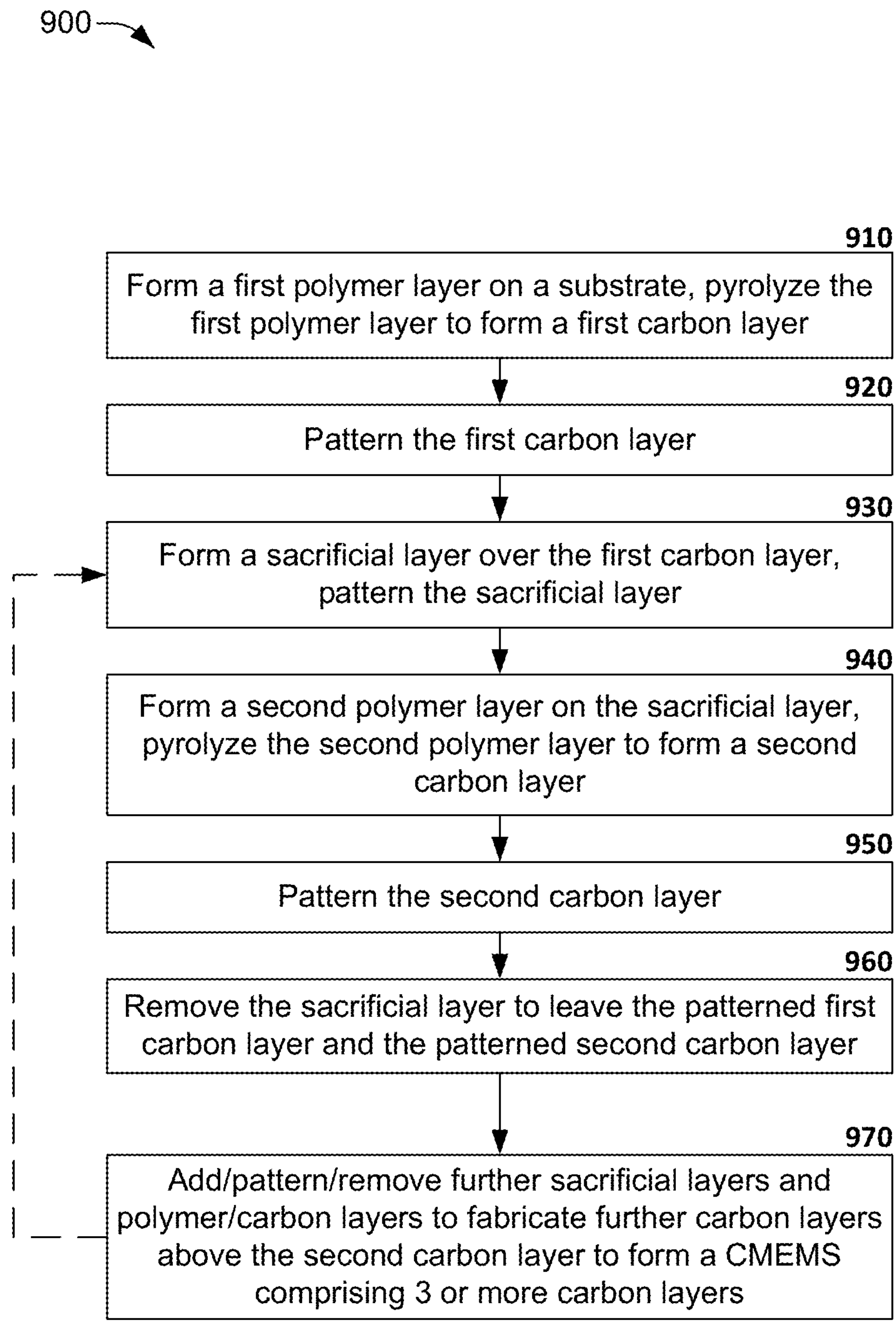
FIG. 9 is a flow diagram illustrating an exemplary methodology for forming a CMEMS comprising a plurality of carbon layers which have been formed by pyrolysis.

FIG. 9 is a methodology 900 relating to fabrication of a CMEMS, wherein the respective carbon layers comprising the bottom contacts, mechanical layer, etc., are formed by pyrolyzing patterned photoresists. While the methodology 900 is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein.

At 910, a base structure can be formed. The base structure comprises a substrate (e.g., a Si wafer or other suitable support) and a subsequently formed layer of pyrolyzed carbon. In an embodiment, the substrate can have an electrical isolation layer formed thereon (e.g., between the substrate and the subsequently formed carbon layer). The carbon layer is formed by spin coating (or other suitable process) a layer of polymer (e.g., a photoresist precursor) over the substrate, wherein the polymer layer is pyrolyzed to decompose the polymer layer to form the carbon layer.

At 920, the first carbon layer is patterned (e.g., to form bottom contacts). Depending upon the thickness of the first carbon layer, a photoresist can be utilized to pattern a thin layer (e.g., <2 μm), or a mask (e.g., a hard mask) can be utilized to pattern a thicker layer.

At 930, a sacrificial layer is formed over the patterned first carbon layer and underlying substrate. The sacrificial layer can be formed from any of polysilicon, $SiO_2$, $Si_3N_4$, a metal, or other material that can be removed, as previously described. The sacrificial layer can be patterned as desired, e.g., to produce a negative profile surface for a subsequently formed carbon layer formed thereon.

At 940, a second polymer layer is formed over the patterned sacrificial layer, wherein the second polymer layer is subsequently pyrolyzed to decompose material forming the second polymer layer to form a second layer of carbon.

At 950, the second carbon layer can be patterned, e.g., with a photoresist (for a thin carbon layer) or a mask (e.g., with a hard mask for a thick carbon layer).

At 960, the sacrificial layer is removed to leave the second carbon layer located over the first carbon layer. Removal of the sacrificial layer causes a region that was previously filled with the sacrificial layer to form an opening (e.g., filled with ambient gas) between the first carbon layer and the second carbon layer. The sacrificial layer can be removed with a vapor pressure system, e.g., utilizing xenon difluoride ($XeF_2$), or a wet or dry etch as previously mentioned.

At 970, the various processes included in acts 930-960 can be repeated as required to form subsequent layers of patterned pyrolyzed carbon over layers of previously formed layers of patterned pyrolyzed carbon, e.g., a second sacrificial layer is formed over the second patterned carbon layer, the second sacrificial layer is patterned, a third polymer layer is formed and pyrolyzed to form a third carbon layer on the second sacrificial layer, the third carbon layer is patterned and the sacrificial layer is removed to facilitate formation of a CMEMS comprising of three patterned carbon layers. Acts 930-960 can be repeated as necessary to facilitate formation of a CMEMS fabricated with p-layers.

Per the foregoing embodiments, an experimental production run increased fabrication from a wafer surface of about 4 square inches ($in^2$) up to 678.6 $in^2$, with scale up only being limited by the size of the fabrication equipment. In an aspect, owing to the dimensional accuracy and according properties (e.g., reduced susceptibility to torsional bending modes) the CMEMS fabricated with the various embodiments presented herein have a plurality of applications. Such applications include high and low gravity accelerometers, strain gauges, comb-drive sensors, diaphragms from MEMS pumps, gas sensors (e.g., having large cross sectional interaction volume for gaseous collisions), etc.

The various layers presented in the foregoing can be formed/deposited by any suitable process such as a thermal processing, phase conversion, spin coating, deposition, CVD process, for example, low pressure chemical vapor deposition (LPCVD), plasma enhanced chemical vapor deposition (PECVD), molecular-beam epitaxy (MBE), liquid-phase epitaxy (LPE), vapor-phase epitaxy (VPE), solid-phase epitaxy (SPE), deposition doping, etc.

Any suitable technique can be used to pattern any of the material layers presented herein. For example, patterning can be created by employing, for example, a photoresist which can be patterned using standard photolithographic techniques to form the required pattern, wherein the photoresist is exposed to electromagnetic radiation through a mask having an image pattern of a desired layout (e.g., desired trenches, openings, line patterning, etc.). Openings are then formed in the photoresist and the underlying layer(s), in order to form the desired structure, e.g., by etching away the exposed material (in the case of a positive photoresist) or etching away the unexposed material (in the case of a negative photoresist). Depending on the material of the photoresist, exposure can create a positive or a negative. With a positive photoresist, exposure causes a chemical change in the photoresist such that the portions of the photoresist layer exposed to light become soluble in a developer. With a negative photoresist, the chemical change induced by exposure renders the exposed portions of the photoresist layer insoluble to the developer. After exposure and development, an opening according to the desired pattern is formed in the membrane layer. A subsequent processing step, such as a deposition step, an etching step, an ion implantation step, etc., can be performed and controlled according to the opening. The photoresist can be subsequently removed. Etching can be by any viable dry or wet etching technique. For example, a wet or dry etching technique can be employed for patterning, while in another aspect, etching can be by a specific anisotropic etch.

Any etching/material removal technique is applicable to the various embodiments, as described herein. Wet etching can be utilized to remove a particular layer where a given layer may be susceptible to etch by a particular etchant while a neighboring layer is not (e.g., selective etching). In another example, anisotropic etching techniques can be utilized to control material removal in a specific direction.

Levelling of layers after formation can be by any suitable technique, e.g., by CMP or other suitable process, to achieve a given dimension, in preparation for the next stage in creation of the CMEMS.

Stripping of a resist layer involves the removal of unwanted resist from the structure, while preventing removal of underlying layers and materials. Any suitable stripper can be utilized as required, such as organic stripper, inorganic stripper, dry stripping, etc. In another example, chemical mechanical polishing or other physical removal process can be used to remove the membrane.

It is to be appreciated that while the formation of CMEMS is described, there may be certain procedures that are not fully disclosed during description of the various embodiments as presented herein. However, rather than provide description of each and every operation involved in the various operations facilitating formation, patterning, removal, etc., of each structure presented herein, for the sake of description only the general operations are described. Hence, while no mention may be presented regarding a particular operation pertaining to aspects of a particular figure, it is to be appreciated that any necessary operation, while either not fully disclosed, or not mentioned, to facilitate formation/deconstruction of a particular layer/element/aspect presented in a particular figure is considered to have been conducted. For example, while no mention may be made regarding a layer described in a preceding figure being leveled (e.g., by CMP, or other suitable operation) it is considered, for the sake of readability of the various exemplary embodiments presented herein, that the leveling process occurred, as have any other necessary operations. It is appreciated that the various operations, e.g., leveling, CMP, patterning, photolithography, deposition, implantation, layer formation, etching, etc., are well known procedures and are not necessarily expanded upon throughout this description.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A method for forming a carbon micromechanical system (CMEMS), the method comprising:

forming a sacrificial layer over a patterned first carbon layer, wherein the first carbon layer is formed by pyrolyzing a first photoresist layer causing material in the first photoresist layer to decompose to form the first carbon layer, wherein the first carbon layer is patterned after pyrolysis of the first photoresist layer;

subsequent to forming the sacrificial layer over the patterned first carbon layer, patterning the sacrificial layer;

depositing a second photoresist layer over the patterned sacrificial layer;

subsequent to depositing the second photoresist layer, pyrolyzing the second photoresist layer to form a second carbon layer;

after pyrolyzing the second photoresist layer, patterning the second carbon layer; and removing the sacrificial layer leaving the patterned second carbon layer located over the patterned first carbon layer, wherein removal of the sacrificial layer causes a region that was previously filled with the sacrificial layer to form an opening between the patterned first carbon layer and the patterned second carbon layer.

2. The method of claim 1, wherein the sacrificial layer comprises polysilicon, silicon dioxide, silicon nitride, a metal, or any other material that can be removed with suitable etching technologies such as dry etch or aqueous dissolution.

3. The method of claim 1, wherein the sacrificial layer is removed with any of a vapor pressure system utilizing xenon difluoride ($XeF_2$), an isotropic dry etch, or an isotropic wet etch.

4. The method of claim 1, wherein the sacrificial layer is formed on the first carbon layer by one of low-pressure chemical vapor deposition (LPCVD), physical vapor deposition, CVD, sputtering, electroplating, or evaporation deposition.

5. The method of claim 1, wherein the first carbon layer and the second carbon layer are patterned through use of a photoresist or a hard mask.

6. The method of claim 5, wherein the hard mask comprises one of silicon dioxide ($SiO_2$), a high-density plasma $SiO_2$, a silane-based material, $SiH_4/Ar/O_2$ high-density plasma oxide, $SiH_4/N_2O/N_2$ based CVD oxide, an alumina-based material ($Al_2O_3$), or physical vapor deposited $Al_2O_3$.

7. The method of claim 1, wherein the first carbon layer and the second carbon layer are patterned through use of an inductively reactive ion plasma (ICP) with $O_2/Ar/SF_6$ chemistry.

8. The method of claim 1, wherein the first carbon layer is patterned to form bottom contacts.

9. The method of claim 1, wherein the second carbon layer is a mechanical layer.

10. The method of claim 1, wherein the first carbon layer and the second carbon layer are formed by pyrolysis at about 1150° C.

11. The method of claim 1, wherein the first carbon layer is formed on a substrate.

12. The method of claim 1, wherein the first carbon layer and the second carbon layer comprise at least one of $sp^2$-hybrid orbital carbon or $sp^3$-hybrid orbital carbon.

13. The method of claim 1, wherein the CMEMS is formed on a 6 inch wafer.

14. The method of claim 1, further comprising:

forming a second sacrificial layer over the patterned second carbon layer;

subsequent to forming the second sacrificial layer over the patterned second carbon layer, patterning the second sacrificial layer;

depositing a third layer of photoresist material over the patterned second sacrificial layer;

subsequent to depositing the third photoresist layer, pyrolyzing the third photoresist layer to form a third carbon layer;

after pyrolyzing the third photoresist layer, patterning the third carbon layer; and removing the second sacrificial layer leaving the patterned third carbon layer located over the patterned second carbon layer, wherein removal of the second sacrificial layer causes a second region that was previously filled with the second sacrificial layer to form a second opening between the patterned second carbon layer and the patterned third carbon layer.

15. A method for fabricating a carbon micromechanical system (CMEMS), the method comprising:

forming a first layer of photoresist material on a substrate, wherein the substrate is a 6 inch silicon wafer;

subsequent to forming the first photoresist layer on the substrate, pyrolyzing the first photoresist layer to form a first carbon layer;

after pyrolyzing the first photoresist layer, patterning the first carbon layer;

forming a sacrificial layer over the patterned first carbon layer;

after forming the sacrificial layer over the patterned first carbon layer, patterning the sacrificial layer;

depositing a second layer of photoresist material over the patterned sacrificial layer;

subsequent to depositing the second photoresist layer, pyrolyzing the second photoresist layer to form a second carbon layer;

after pyrolyzing the second photoresist layer, patterning the second carbon layer; and removing the sacrificial layer leaving the patterned second carbon layer located over the patterned first carbon layer, wherein removal of the sacrificial layer causes a region that was previously filled with the sacrificial layer to form an opening between the patterned first carbon layer and the patterned second carbon layer.

* * * * *